(12) United States Patent
Liu

(10) Patent No.: US 9,356,104 B2
(45) Date of Patent: May 31, 2016

(54) STRUCTURE AND FORMATION METHOD OF SEMICONDUCTOR DEVICE WITH GATE STACK

(71) Applicant: Taiwan Semiconductor Manufacturing Co., Ltd, Hsin-Chu (TW)

(72) Inventor: Yung-Tsun Liu, Taipei (TW)

(73) Assignee: TAIWAN SEMICONDUCTOR MANUFACTURING CO., LTD., Hsin-Chu (TW)

(*) Notice: Subject to any disclaimer, the term of this patent is extended or adjusted under 35 U.S.C. 154(b) by 0 days.

(21) Appl. No.: 14/458,588

(22) Filed: Aug. 13, 2014

(65) Prior Publication Data

US 2016/0049482 A1    Feb. 18, 2016

(51) Int. Cl.
*H01L 29/66* (2006.01)
*H01L 29/417* (2006.01)
*H01L 29/78* (2006.01)
*H01L 21/28* (2006.01)
*H01L 21/283* (2006.01)

(52) U.S. Cl.
CPC ........ *H01L 29/41775* (2013.01); *H01L 21/283* (2013.01); *H01L 21/28008* (2013.01); *H01L 29/78* (2013.01)

(58) Field of Classification Search
CPC .......................... H01L 29/7436; H01L 29/747
USPC .................................... 257/122, 288; 438/586
See application file for complete search history.

(56) References Cited

U.S. PATENT DOCUMENTS

| | | | |
|---|---|---|---|
| 2005/0170601 A1* | 8/2005 | Yoon | H01L 21/02178 438/396 |
| 2005/0184292 A1* | 8/2005 | Kwak | H01L 27/1108 257/70 |
| 2007/0080387 A1* | 4/2007 | Liu | H01L 28/82 257/303 |
| 2012/0034773 A1* | 2/2012 | Ott | H01L 21/2807 438/592 |

* cited by examiner

*Primary Examiner* — Jami M Valentine
(74) *Attorney, Agent, or Firm* — Birch, Stewart, Kolasch & Birch, LLP (57) ABSTRACT

A structure and a formation method of a semiconductor device are provided. The semiconductor device includes a semiconductor substrate and a gate stack over the semiconductor substrate. The semiconductor device also includes a contact etch stop layer over the semiconductor substrate and sidewalls of the gate stack. The semiconductor device further includes a dielectric layer over the contact etch stop layer. In addition, the semiconductor device includes an interfacial layer between the contact etch stop layer and the dielectric layer.

20 Claims, 11 Drawing Sheets

STRUCTURE AND FORMATION METHOD OF SEMICONDUCTOR DEVICE WITH GATE STACK

BACKGROUND

The semiconductor integrated circuit (IC) industry has experienced rapid growth. Continuing advances in semiconductor manufacturing processes have resulted in semiconductor devices with finer features and/or higher degrees of integration. Functional density (i.e., the number of interconnected devices per chip area) has generally increased while feature size (i.e., the smallest component that can be created using a fabrication process) has decreased.

The scaling-down process generally provides benefits by increasing production efficiency and lowering associated costs. However, these advances have increased the complexity of processing and manufacturing ICs. Since feature sizes continue to decrease, fabrication processes continue to become more difficult to perform.

Therefore, it is a challenge to form reliable semiconductor devices at smaller and smaller sizes.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Some embodiments of the disclosure are described. FIGS. 1A-1K are cross-sectional views of various stages of a process for forming a semiconductor device, in accordance with some embodiments. Additional operations can be provided before, during, and/or after the stages described in FIGS. 1A-1K. Some of the stages described can be replaced or eliminated for different embodiments. Additional features can be added in the semiconductor device. Some of the features described below can be replaced or eliminated for different embodiments.

Figure 1A:
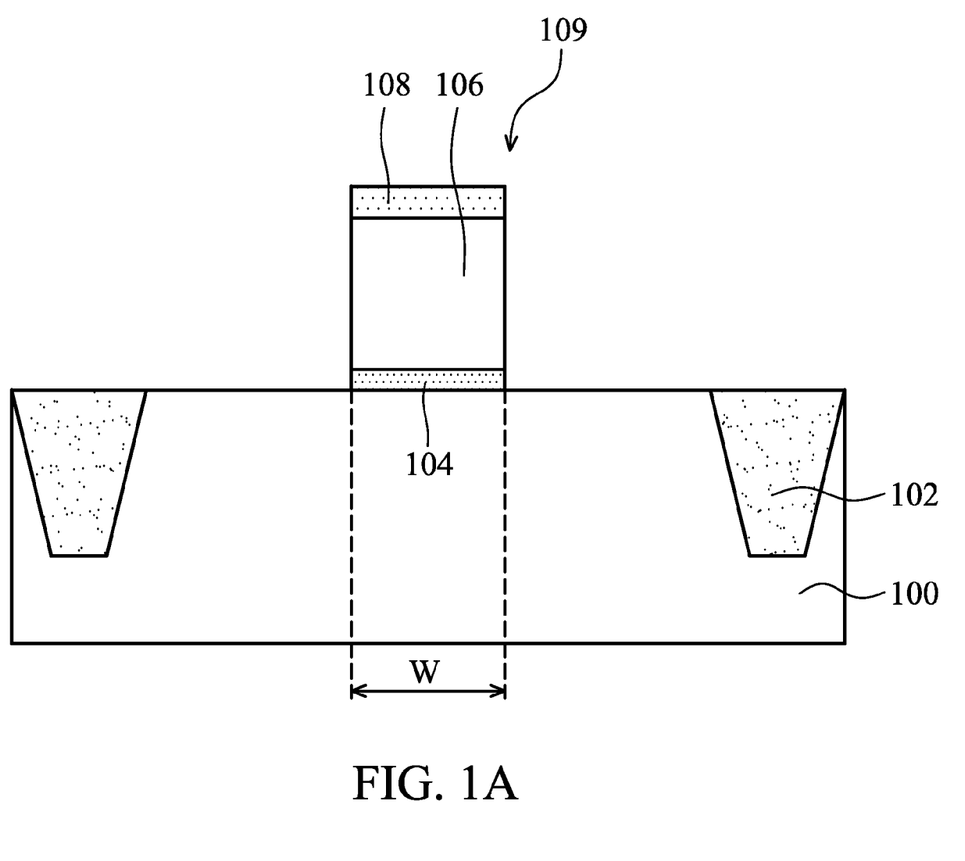
FIGS. 1A-1K are cross-sectional views of various stages of a process for forming a semiconductor device, in accordance with some embodiments.

As shown in FIG. 1A, a semiconductor substrate 100 is provided. In some embodiments, the semiconductor substrate 100 is a bulk semiconductor substrate. The bulk semiconductor substrate may be a semiconductor wafer such as a silicon wafer. In some embodiments, the semiconductor substrate 100 includes an elementary semiconductor material such as silicon or other elementary semiconductor materials such as germanium. In some other embodiments, the semiconductor substrate 100 includes a compound semiconductor. The compound semiconductor may include silicon carbide, gallium arsenide, indium arsenide, indium phosphide, another suitable compound semiconductor, or a combination thereof.

In some embodiments, the semiconductor substrate 100 is a semiconductor-on-insulator (SOI) substrate. In some embodiments, the SOI substrate is fabricated by using a separation by implantation of oxygen (SIMOX) process, a wafer bonding process, another applicable method, or a combination thereof.

As shown in FIG. 1A, isolation features 102 are formed in the semiconductor substrate 100, in accordance with some embodiments. The isolation features 102 are used to define and electrically isolate various device elements formed in the semiconductor substrate 100. In some embodiments, the isolation features 102 include shallow trench isolation (STI) features, local oxidation of silicon (LOCOS) features, another suitable isolation features, or a combination thereof. In some embodiments, each of the isolation features 102 has a multi-layer structure.

Examples of the various device elements that may be formed in semiconductor die 100 include transistors (e.g., metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc.), diodes, another suitable element, or a combination thereof. Various processes are performed to form the various device elements, such as deposition, etching, implantation, photolithography, annealing, planarization, another applicable process, or a combination thereof.

In some embodiments, the semiconductor substrate 100 includes various doped regions (not shown) depending on design requirements of the semiconductor device. The doped regions include, for example, p-type wells and/or n-type wells. In some embodiments, the doped regions are doped with p-type dopants. For example, the doped regions are doped with boron or $BF_2$. In some embodiments, the doped regions are doped with n-type dopants. For example, the doped regions are doped with phosphor or arsenic. In some embodiments, some of the doped regions are p-type doped, and the other doped regions are n-type doped.

As shown in FIG. 1A, a gate dielectric layer 104 and a gate electrode 106 are formed over the semiconductor substrate 100, in accordance with some embodiments. In some embodiments, a gate dielectric material and a gate electrode layer are deposited over the semiconductor substrate 100. Afterwards, the gate dielectric material and the gate electrode layer are patterned to form the gate dielectric layer 104 and the gate electrode 106. The gate dielectric layer 104 and the gate electrode 106 together form a gate stack 109, as shown in FIG. 1A. The gate stack 109 has a width W. In some embodiments, the width W is in a range from about 15 nm to about 30 nm. In some other embodiments, the width W is in a range from about 20 nm to about 25 nm.

In some embodiments, the gate stack 109 includes a hard mask 108. The hard mask 108 is used to assist in the patterning of the gate dielectric material and the gate electrode layer. In some embodiments, the hard mask 108 is made of silicon oxide, silicon nitride, silicon oxynitride, silicon carbide, another suitable material, or a combination thereof. In some embodiments, the hard mask 108 has a multi-layer structure.

In some embodiments, the gate dielectric material and the gate electrode layer are sequentially deposited by using suitable deposition methods. The suitable deposition methods may include a chemical vapor deposition (CVD) process, an atomic layer deposition (ALD) process, a thermal oxidation process, a physical vapor deposition (PVD) process, another applicable process, or a combination thereof.

Afterwards, a patterning process including, for example, photolithography and etching processes is performed to pattern the gate dielectric material and the gate electrode layer. The photolithography process may include resist coating (such as spin-on coating), soft baking, mask aligning, exposure, post-exposure baking, developing the resist, rinsing, drying (such as hard baking), another applicable operation, or a combination thereof. Alternatively, other processes may be used, such as a maskless photolithography process, an electron beam writing process, an ion beam writing process, another applicable process, or a combination thereof.

In some embodiments, the photolithography process is used to form the hard mask 108 with a desired pattern. Afterwards, the etching process is performed to transfer the pattern of the hard mask 108 to the gate dielectric material and the gate electrode layer. As a result, the gate stack 109 is formed. The etching process may include a dry etching process, a wet etching process, or a combination thereof.

In some embodiments, the gate dielectric layer 104 is made of silicon oxide, silicon nitride, silicon oxynitride, dielectric material with high dielectric constant (high-K), another suitable dielectric material, or a combination thereof. Examples of high-K dielectric materials include hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 104 is a dummy gate dielectric layer which will be removed in a subsequent process. The dummy gate dielectric layer is, for example, a silicon oxide layer.

In some embodiments, the gate electrode 106 includes polysilicon, a metal material, another suitable conductive material, or a combination thereof. In some embodiments, the gate electrode 106 is a dummy gate electrode layer and will be replaced with another conductive material such as a metal material. The dummy gate electrode layer is made of, for example, polysilicon.

Figure 1B:
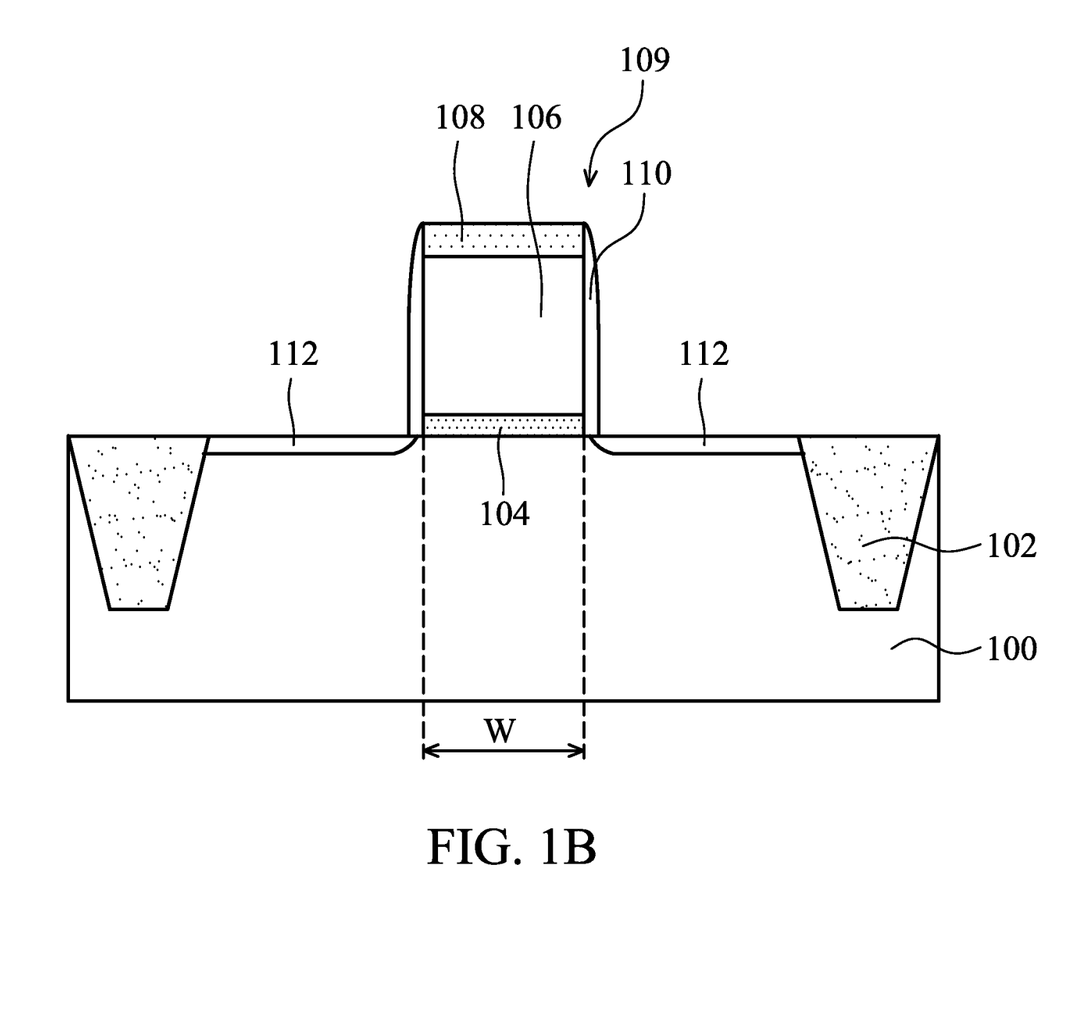

As shown in FIG. 1B, sealing elements 110 are formed over opposite sidewalls of the gate stack 109, in accordance with some embodiments. The sealing elements 110 may be used to protect the gate stack 109. The sealing element 110 may also be used to assist in the formation of a lightly doped source and drain region. In some embodiments, the sealing elements 110 are made of silicon oxide, silicon oxynitride, another suitable material, or a combination thereof.

In some embodiments, a sealing layer is deposited over the semiconductor substrate 100 and the gate stack 109. The sealing layer may be deposited using a CVD process, a PVD process, a spin-on process, another applicable process, or a combination thereof. Afterwards, an etching process, such as an anisotropic etching process, is performed to partially remove the sealing layer. As a result, the sealing layer remaining over the sidewalls of the gate stack 109 forms the sealing elements 110.

Afterwards, a light ion implantation process is performed to form lightly doped regions 112 in the semiconductor substrate 100, as shown in FIG. 1A in accordance with some embodiments. The lightly doped regions 112 are positioned at each side of the gate stack 109, respectively. The lightly doped regions 112 are serve as lightly doped source and drain region (LDS/D region) of the semiconductor device.

Figure 1C:
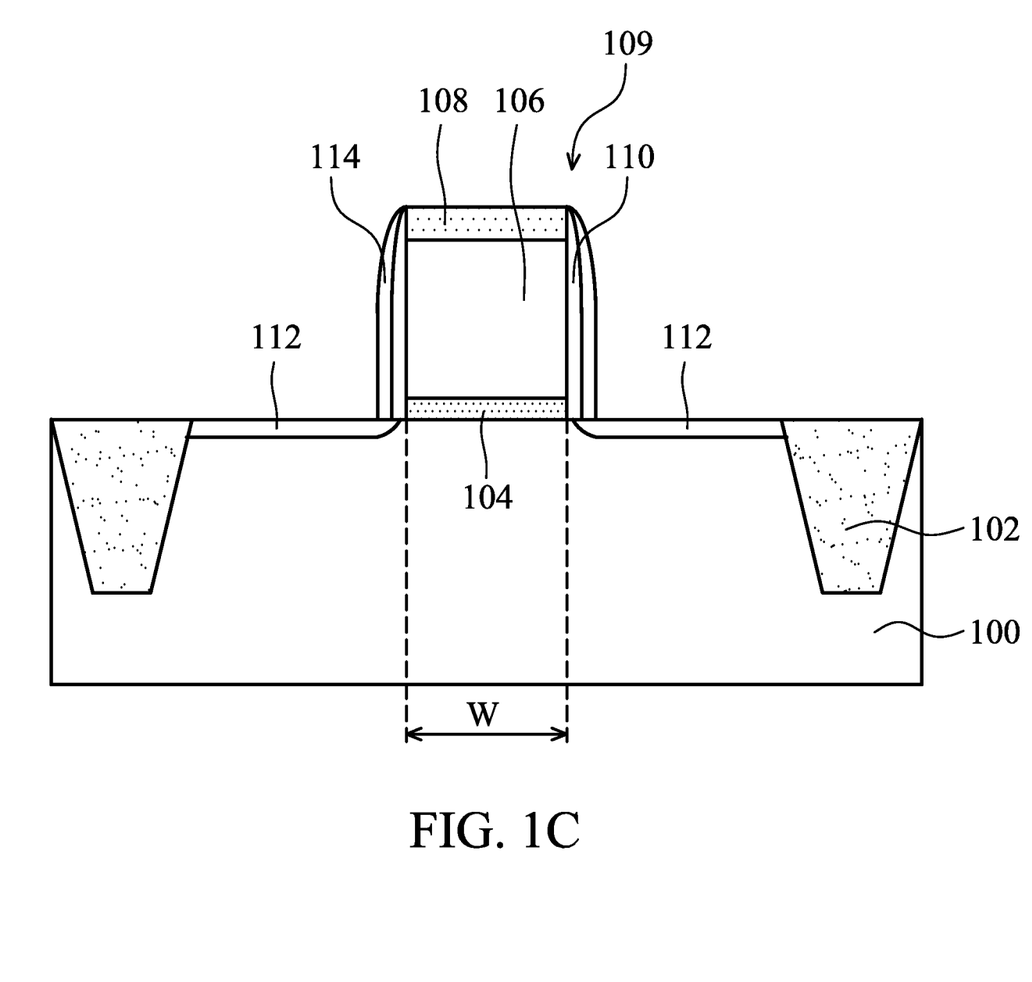

As shown in FIG. 1C, spacer elements 114 are formed over the sealing elements 110, as shown in FIG. 1A in accordance with some embodiments. The spacer elements 114 may be used to assist in the formation of source and drain features (or regions) in subsequent processes. In some embodiments, the spacer elements 114 are made of silicon nitride, silicon oxynitride, another suitable material, or a combination thereof.

In some embodiments, a spacer layer is deposited over the semiconductor substrate 100, the sealing elements 110, and the gate stack 109. In some embodiments, the spacer layer is deposited using a CVD process, a PVD process, a spin-on process, another applicable process, or a combination thereof. Afterwards, an etching process, such as an anisotropic etching process, is performed to partially remove the spacer layer. As a result, the spacer layer remaining over the sealing elements 110 forms the spacer elements 114.

Embodiments of the disclosure have many variations. In some embodiments, the spacer elements 114 are not formed. In some other embodiments, nither the sealing elements 110 nor the spacer elements 114 are formed. In some other embodiments, the spacer elements 114 are formed, and will be removed in a subsequent process.

Figure 1D:
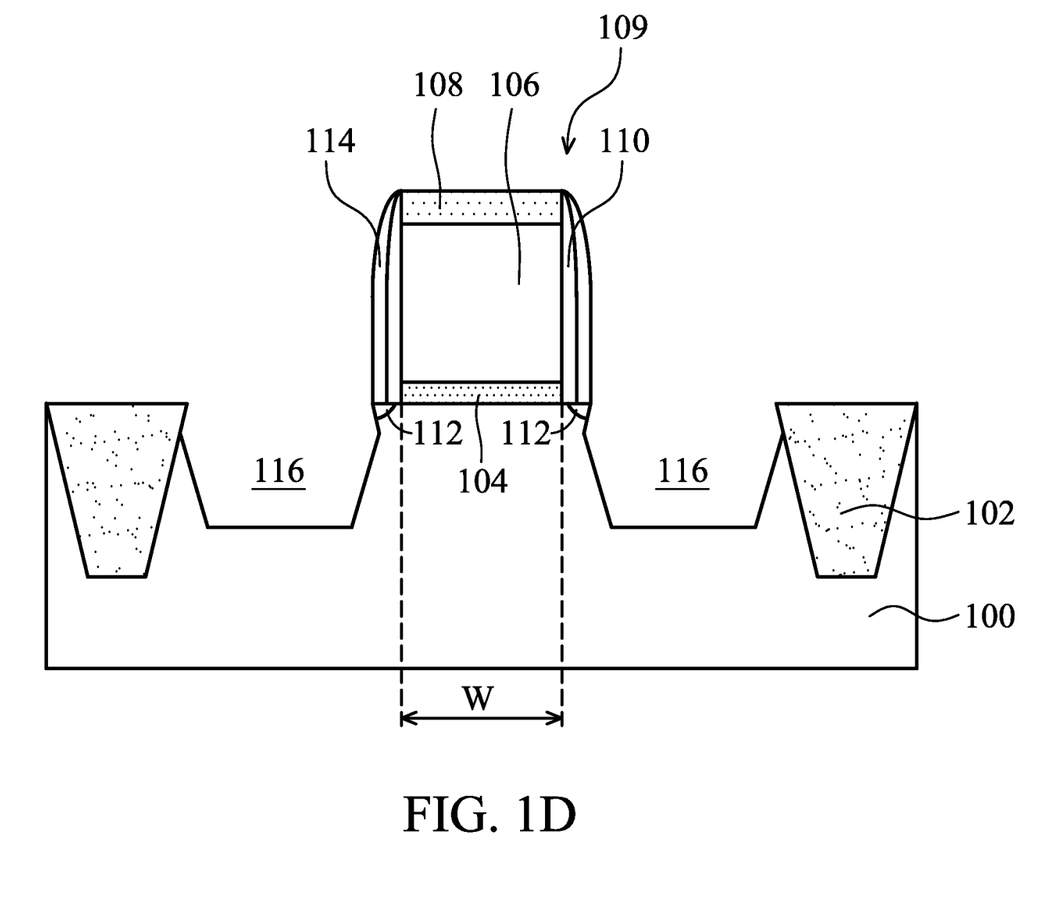

As shown in FIG. 1D, a portion of the semiconductor substrate 100 is removed to form recesses 116, in accordance with some embodiments. In some embodiments, the recesses 116 are formed by using an etching process. The etching process may include a dry etching process, a wet etching process, or a combination thereof. Process parameters of the etching process may be fine-tuned to achieve desired profiles of the recesses 116. For example, etchants used, etching temperature, etching solution concentration, etching pressure, source power, bias voltage, bias power, etchant flow rate, and/or another suitable parameter may be tuned.

In an example, the dry etching process is a plasma etching process that uses a fluorine-containing etchant, a chlorine-containing etchant, a bromine-containing etchant, another suitable etchant, or a combination thereof. In an example, the wet etching process uses a wet etching solution that includes $NH_4OH$, HF (hydrofluoric acid), TMAH (tetramethylammonium hydroxide), another suitable wet etching solution, or a combination thereof. In some embodiments, a pre-cleaning process is performed to clean the recesses 116. For example, a HF solution or other suitable solution is used to clean the recesses 116.

Afterwards, source and drain features (or regions) will be formed in the recesses 116. In some embodiments, a barrier region (not shown) is formed along the surface of the semiconductor substrate 100. The barrier region may be used to provide a barrier around the recesses 116 that prevent out-diffusing of dopants. In some embodiments, the barrier region is formed by using an ion implantation process, a plasma treating process, another applicable process, or a combination thereof. In some embodiments, a decoupled plasma nitridation process is performed to form the barrier region. In some embodiments, a carbon implantation process is used to form the barrier region. In some other embodiments, the barrier region includes other suitable dopants. Embodiments of the disclosure have many variations. In some other embodiments, the barrier region is not formed.

Figure 1E:
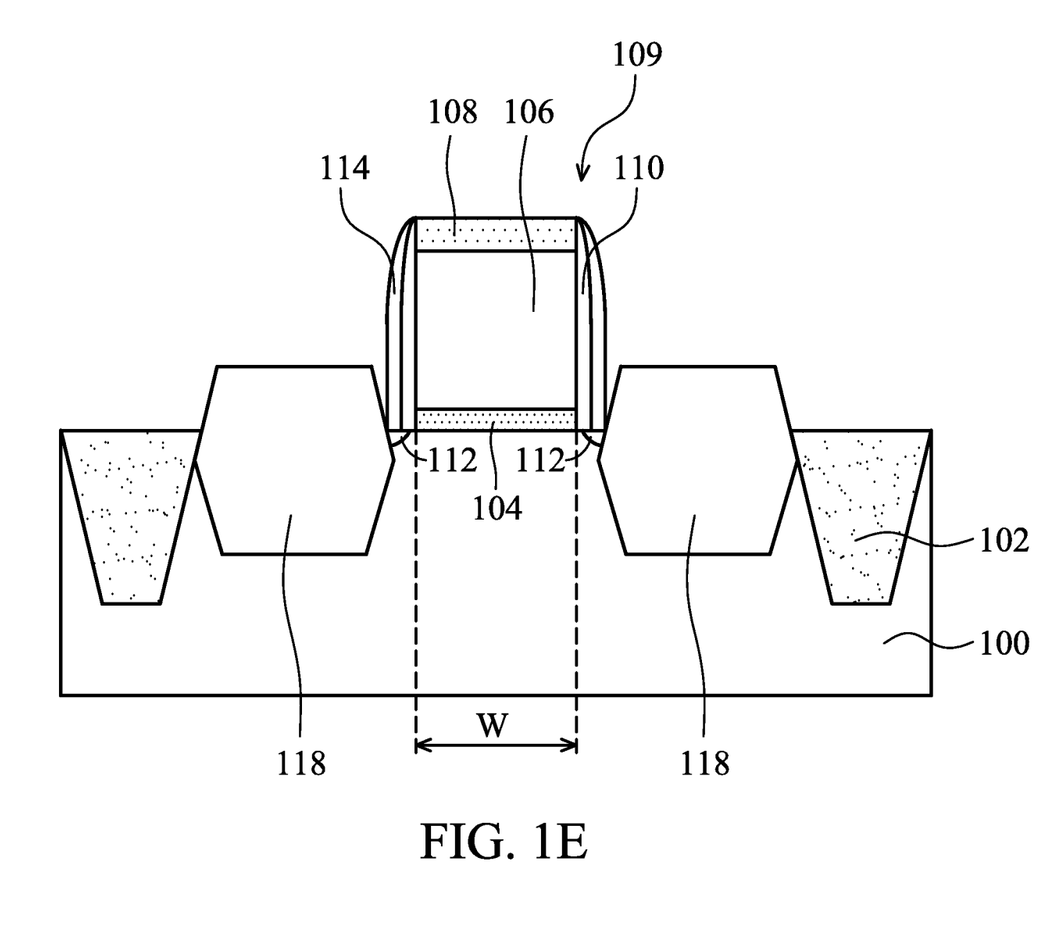

As shown in FIG. 1E, source/drain features 118 are formed in the recesses 116, in accordance with some embodiments. In some embodiments, one or more semiconductor materials are epitaxially grown in the recesses 116 to form the source/drain features 118. In some embodiments, the source/drain features 118 protrude from the semiconductor substrate 100. Upper surfaces of the source/drain features 118 are positioned higher than the isolation features 102. The source/drain features 118 may alternatively be referred to as raised source and drain regions.

In some embodiments, the source/drain features 118 are strained structures. The source/drain features 118 provide stress or strain to the channel region under the gate stack 109 to enhance carrier mobility of the device and improve device performance. In some embodiments, the source/drain features 118 include epitaxially grown silicon germanium (SiGe). In some other embodiments, the source/drain features 118 includes epitaxially grown silicon, epitaxially grown silicon carbide (SiC), or epitaxially grown silicon phosphide (SiP).

In some embodiments, the source/drain features 118 are formed by using a selective epitaxy growth (SEG) process, a CVD process (e.g., a vapor-phase epitaxy (VPE) process and/or an ultra-high vacuum CVD (UHV-CVD) process), a molecular beam epitaxy process, another applicable process, or a combination thereof. The formation process of the source/drain features 118 may use gaseous and/or liquid precursors, which may interact with the composition of the semiconductor substrate 100.

In some embodiments, the source/drain features 118 are doped with one or more suitable dopants. For example, the source/drain features 118 are SiGe source/drain features doped with boron (B). The source and drain features 118 may be doped with other suitable dopants, such as carbon (C) or antimony (Sb). Alternatively, the source/drain features 118 are Si source/drain features doped with antimony (Sb) or carbon (C).

In some embodiments, the source and drain features 118 are in-situ doped during the growth of the source and drain features 118. In some other embodiments, the source and drain features 118 are not doped during the growth of the source and drain features 118. After the formation of the source and drain features 118, the source and drain features 118 are doped in a subsequent process. In some embodiments, the doping is achieved by using an ion implantation process, a plasma immersion ion implantation process, a gas and/or solid source diffusion process, another applicable process, or a combination thereof. In some embodiments, the source and drain features 118 are further exposed to annealing processes to activate the implanted dopants. For example, a rapid thermal annealing process is performed.

Embodiments of the disclosure have many variations. In some other embodiments, the recesses 116 and the source/drain features 118 are not formed. In some embodiments, after the formation of the spacer elements 114, doped regions serving as source/drain regions (or source/drain features) are formed in the semiconductor substrate 100. An ion implantation process may be used to form the doped regions.

Figure 1F:
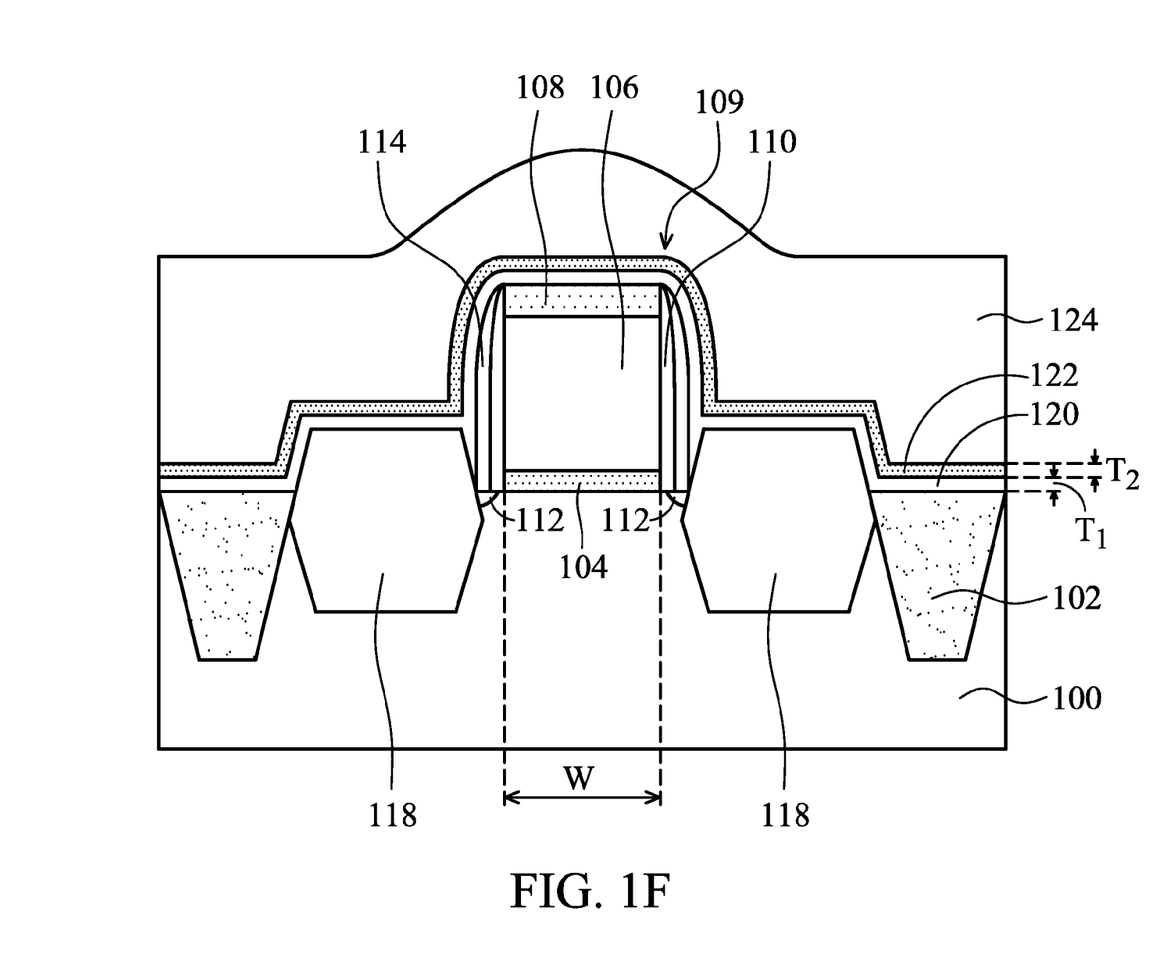

As shown in FIG. 1F, a contact etch stop layer 120 is deposited over the semiconductor substrate 100, the source/drain features 118, the spacer elements 114, and the gate stack 109, in accordance with some embodiments. The contact etch stop layer 120 is used for controlling the end point during subsequent contact hole formation. In some embodiments, the contact etch stop layer 120 is conformally deposited over the semiconductor substrate 100, the spacer elements 114, and the gate stack 109.

In some embodiments, the contact etch stop layer 120 is made of silicon nitride, silicon oxynitride, silicon carbide, another suitable material, or a combination thereof. In some embodiments, the contact etch stop layer 120 is deposited by using a CVD process, a physical vapor deposition (PVD) process, a spin-on process, another applicable process, or a combination thereof. The contact etch stop layer 120 has a thickness $T_1$. In some embodiments, the thickness $T_1$ is in a range from about 2 nm to about 10 nm. In some other embodiments, the thickness $T_1$ is in a range from about 6 nm to about 9 nm.

Afterwards, an interfacial layer 122 is deposited over the contact etch stop layer 120, as shown in FIG. 1F in accordance with some embodiments. In some embodiments, the interfacial layer 122 is conformally formed over the contact etch stop layer 120. In some embodiments, the interfacial layer 122 is has a good adhesion with the contact etch stop layer 120. In some embodiments, the interfacial layer 122 is in direct contact with the contact etch stop layer 120. In some embodiments, the interfacial layer 122 is made of a dielectric material. The dielectric material may include silicon oxide, silicon oxynitride, another suitable material, or a combination thereof. In some embodiments, the interfacial layer 122 includes hydroxyl groups. In some embodiments, the interfacial layer 122 and the contact etch stop layer 120 are made of different materials.

In some embodiments, the interfacial layer 122 is deposited by using an atomic layer deposition (ALD) process, a CVD process, a spin-on process, a PVD process, another applicable process, or a combination thereof. For example, silanediamine, N,N,N',N'-tetraethyl ($C_8H_{22}N_2Si$) is used as a process precursor. Other suitable gas (such as $O_2$, Ar, and/or lie) may also be used to assist in the formation of the interfacial layer 122. Other suitable precursor may also be used to form the interfacial layer 122. A material layer which is capable of providing good adhesion with the contact etch stop layer 120 and a subsequently formed dielectric layer may be used as the interfacial layer 122.

In some embodiments, the interfacial layer 122 is a single layer. The interfacial layer 122 has a thickness $T_2$. In some embodiments, the thickness $T_2$ is in a range from about 1 nm to about 10 nm. In some other embodiments, the thickness $T_2$ is in a range from about 3 nm to about 8 nm. In some embodiments, the ratio of the width W of the gate stack 109 to the thickness $T_2$ of the interfacial layer 122 ($W/T_2$) is in a range from about 1.5 to about 22.

Embodiments of the disclosure have many variations. In some other embodiments, the interfacial layer 122 has a multi-layer structure which includes multiple sub-layers. In some embodiments, the sub-layers are made of the same material. In some other embodiments, some of the sub-layers are made of different materials. In some embodiments, each of the sub-layers has substantially the same thickness. In some other embodiments, some of the sub-layers have different thicknesses.

Afterwards, a dielectric layer 124 is deposited over the interfacial layer 122, as shown in FIG. 1F in accordance with some embodiments. In some embodiments, the dielectric layer 124 and the interfacial layer 122 are made of different materials. In some embodiments, the interfacial layer 122 includes more hydroxyl groups than the dielectric layer 124. In some embodiments, the dielectric layer 124 has a good adhesion with the interfacial layer 122. In some embodiments, the interfacial layer 122 is in direct contact with the dielectric layer 124. In some other embodiments, the interfacial layer 122 is in direct contact with both of the dielectric layer 124 and the contact etch stop layer 120. In some embodiments, the dielectric layer 124 is separated from the contact etch stop layer 120 by the interfacial layer 122. In these cases, the dielectric layer 124 is not in direct contact with the contact etch stop layer 120.

In some embodiments, the dielectric layer 124 is made of silicon oxide or another suitable material. In some embodiments, the dielectric layer 124 is made of a low-k dielectric material. The low-k dielectric material has a dielectric constant smaller than that of silicon oxide. For example, the low-k dielectric material has a dielectric constant in a range from about 1.2 to about 3.5.

As the density of semiconductor devices increases and the size of circuit elements becomes smaller, the resistance capacitance (RC) delay time increasingly dominates circuit performance. Using a low-k dielectric material as the dielectric layer 124 is helpful for reducing the RC delay.

In some embodiments, the dielectric layer 124 includes a spin-on inorganic dielectric, a spin-on organic dielectric, a porous dielectric material, an organic polymer, an organic silica glass, SiOF series material, a hydrogen silsesquioxane (HSQ) series material, a methyl silsesquioxane (MSQ) series material, a porous organic series material, another suitable material, or a combination thereof. In some embodiments, the dielectric layer 124 includes a material including Si, C, O, or H. For example, the dielectric layer 124 includes $SiO_2$, SiOC, SiON, SiCOH, SiOCN, or a combination thereof. In some embodiments, the dielectric layer 124 is made of carbon-doped silicon oxide. The carbon-doped silicon oxide may also be referred to as organosilicate glass (OSG) or C-oxide. In some embodiments, the carbon-doped silicon oxide includes methyl silsesquioxane (MSQ), hydrogen silsesquioxane (HSQ), polysilsesquioxane, another suitable material, or a combination thereof. In some embodiments, the dielectric layer 124 includes fluorine-doped silicate glass (FSG) such as fluorine-doped —(O—Si(CH$_3$)$_2$—O)—. In some embodiments, the dielectric layer 124 is deposited by using a CVD process, a spin-on process, a spray coating process, another applicable process, or a combination thereof.

Figure 1G:
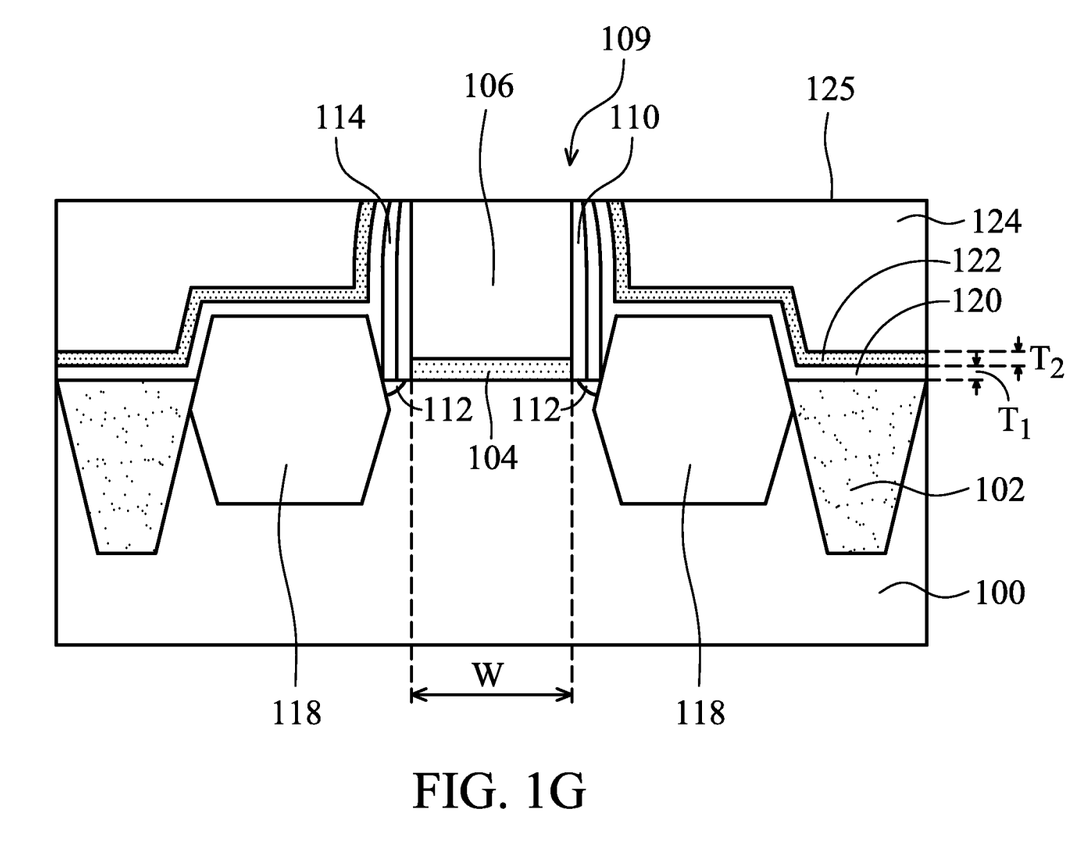

As shown in FIG. 1G, a planarization process is performed on the dielectric layer 124 to provide the dielectric layer 124 a substantially planar surface 125, in accordance with some embodiments. In some embodiments, the hard mask 108 is removed to expose the gate electrode 106 after the planarization process. The planarization process may include a chemical mechanical polishing (CMP) process, a grinding process, an etching process, another applicable process, or a combination thereof.

In some embodiments, the interfacial layer 122 has good adhesion with the dielectric layer 124 and the contact etch stop layer 120. Therefore, the structure stability and strength of the stack structure including the dielectric layer 124, the interfacial layer 122, and the contact etch stop layer 120 are improved. As a result, there is substantially no crack formed in the stack structure after the planarization process. Device reliability and performance are thus improved.

As mentioned above, the gate electrode 106 is a dummy gate electrode in some embodiments. In these cases, a gate replacement process is performed to replace the dummy gate electrode with a new gate electrode, such as a metal gate electrode.

Figure 1H:
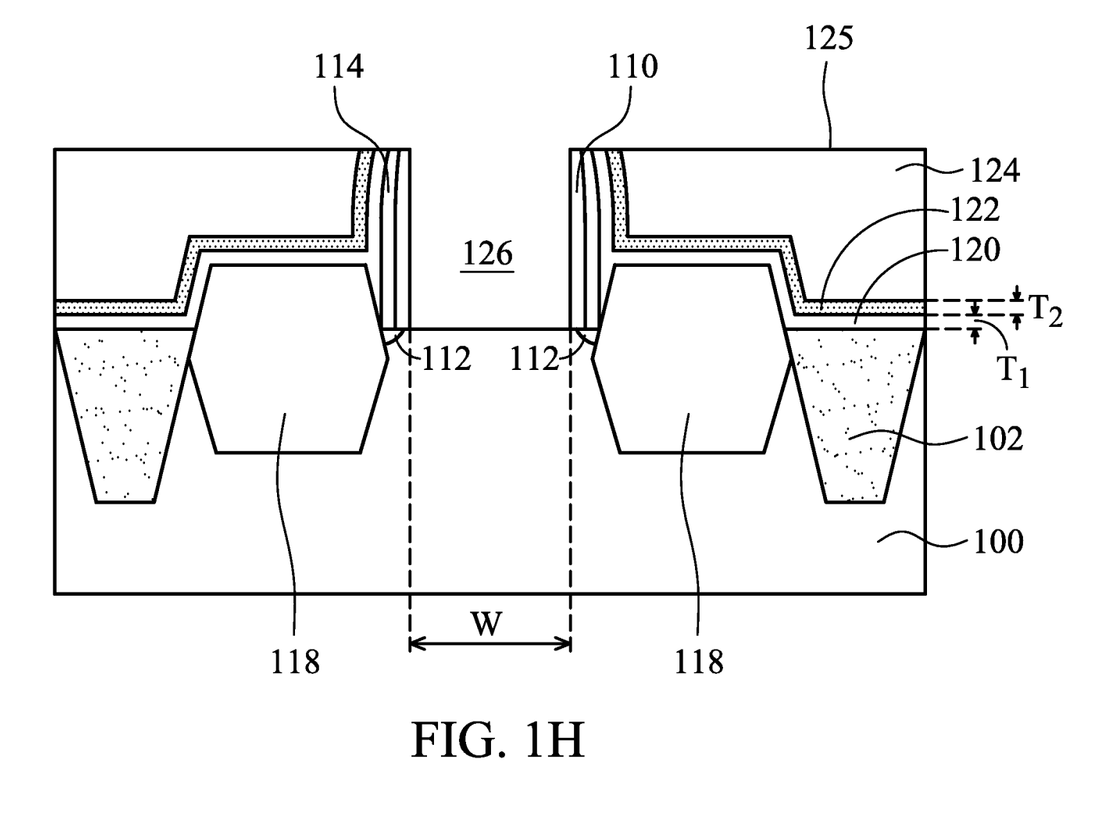

As shown in FIG. 1H, the gate electrode 106 and the gate dielectric layer 104 are removed to form a recess (or a trench) 126 between the sealing elements 110, in accordance with some embodiments. In these cases, the gate dielectric layer 104 is also a dummy gate dielectric layer. In some other embodiments, the gate electrode 106 is removed, and the gate dielectric layer 104 is not removed. In these cases, the gate dielectric layer 104 may be a high-k material and will not be replaced. In some embodiments, one or more etching processes are used to form the recess 126. For example, different etchants are sequentially used to remove the gate electrode 106 and the gate dielectric layer 104.

The interfacial layer 122 has good adhesion with the dielectric layer 124 and the contact etch stop layer 120. The bonding between the dielectric layer 124, the interfacial layer 122, and the contact etch stop layer 120 are strong. The reliability of the stack structure constructed by the dielectric layer 124, the interfacial layer 122, and the contact etch stop layer 120 is improved. Therefore, there is substantially no crack formed in the stack structure after the removal of the gate electrode 106 and the gate dielectric layer 104. Device reliability and performance are thus improved. In some other cases, the interfacial layer 122 is not formed. In these cases, there may be cracks formed after the removal of the gate electrode 106 and the gate dielectric layer 104.

Figure 1I:
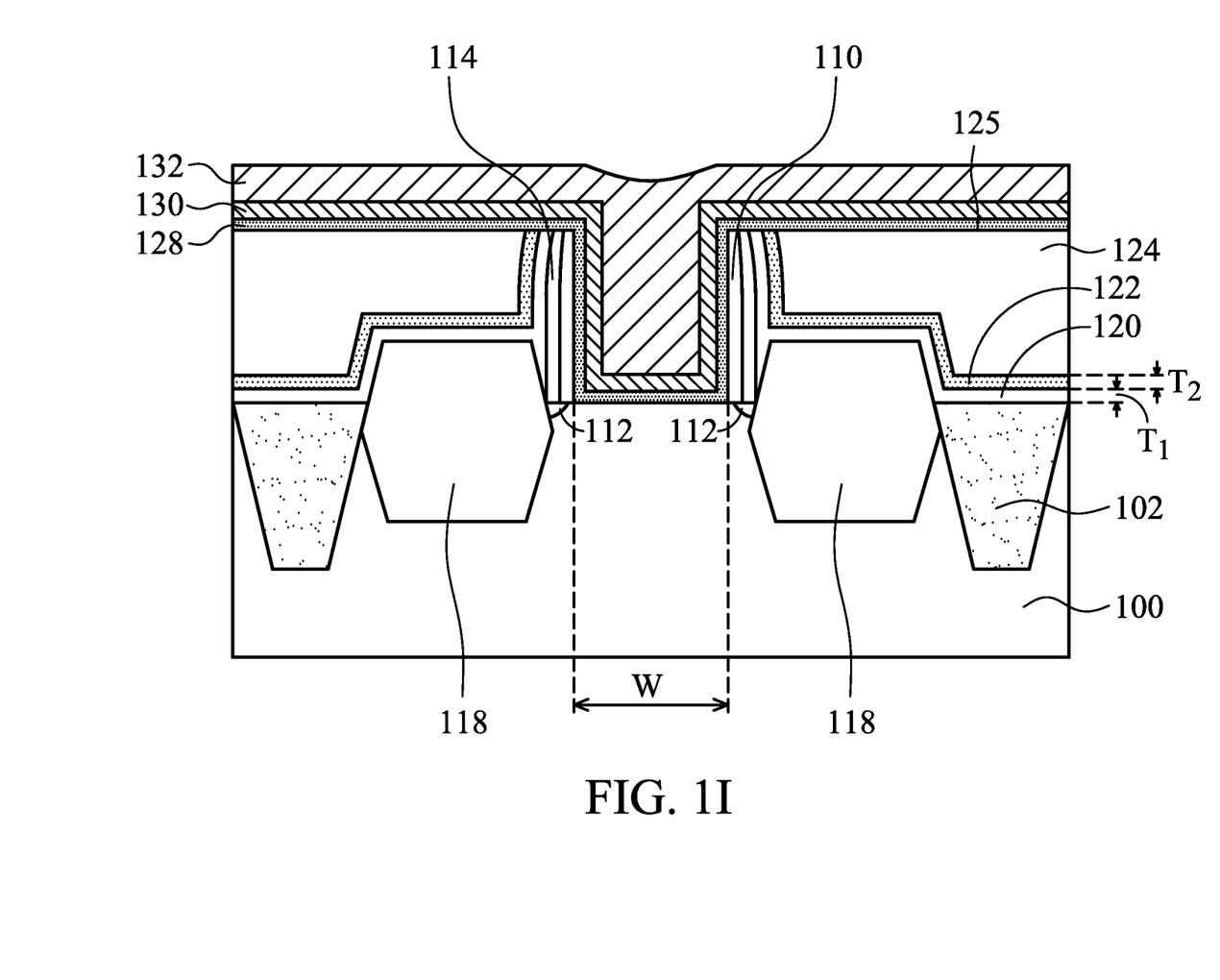

As shown in FIG. 1I, a gate dielectric layer 128 is deposited over the dielectric layer 124 and sidewalls and a bottom portion of the recess 126, in accordance with some embodiments. The gate dielectric layer 128 includes a high-k material. In some embodiments, the gate dielectric layer 128 is made of hafnium oxide, zirconium oxide, aluminum oxide, hafnium dioxide-alumina alloy, hafnium silicon oxide, hafnium silicon oxynitride, hafnium tantalum oxide, hafnium titanium oxide, hafnium zirconium oxide, another suitable high-K material, or a combination thereof. In some embodiments, the gate dielectric layer 128 is deposited by using an ALD process, a CVD process, a PVD process, a spin-on process, another applicable process, or a combination thereof.

Afterwards, a work function layer 130 is deposited over the gate dielectric layer 128, as shown in FIG. 1I in accordance with some embodiments. The work function layer 130 is used to provide desired work function for transistors to enhance device performance including improved threshold voltage.

In the embodiments of forming an NMOS transistor, the work function layer can be an n-type metal layer capable of providing a work function value suitable for the device, such as equal to or less than about 4.5 eV. The n-type metal layer may include metal, metal carbide, metal nitride, or a combination thereof. For example, the n-type metal layer includes titanium nitride, tantalum, tantalum nitride, other suitable materials, or a combination thereof.

On the other hand, in the embodiments of forming a PMOS transistor, the work function layer can be a p-type metal layer capable of providing a work function value suitable for the device, such as equal to or greater than about 4.8 eV. The p-type metal layer may include metal, metal carbide, metal nitride, other suitable materials, or a combination thereof. For example, the p-type metal includes tantalum nitride, tungsten nitride, titanium, titanium nitride, other suitable materials, or a combination thereof.

The work function layer may also be made of hafnium, zirconium, titanium, tantalum, aluminum, metal carbides (e.g., hafnium carbide, zirconium carbide, titanium carbide, aluminum carbide), aluminides, ruthenium, palladium, platinum, cobalt, nickel, conductive metal oxides, or a combinations thereof. The thickness and/or the compositions of the work function layer may be tuned to adjust the work function level. For example, a titanium nitride layer may be used as a p-type metal layer or an n-type metal layer, depending on the thickness and/or the compositions of the titanium nitride layer.

In some embodiments, a barrier layer (not shown) is formed between the work function layer 130 and the gate dielectric layer 128. The barrier layer may be used to interface the gate dielectric layer 128 with the work function layer 130. The barrier layer may also be used to prevent diffusion between the gate dielectric layer 128 and the work function layer 130. The barrier layer may be made of titanium nitride, tantalum nitride, another suitable material, or a combination thereof. The barrier layer may be formed by using a CVD process, a PVD process, an ALD process, another applicable process, or a combination thereof.

As shown in FIG. 1I, a metal filling layer 132 is deposited over the work function layer 130 to fill the recess 126, in accordance with some embodiments. In some embodiments, the metal filling layer 132 is made of aluminum, tungsten, copper, another suitable material, or a combination thereof. In some embodiments, the metal filling layer 132 is deposited by using a PVD process, an electroplating process, a CVD process, an electroless plating process, another applicable process, or a combination thereof.

In some embodiments, a blocking layer (not shown) is formed between the metal filling layer 132 and the work function layer 130. The blocking layer may be used to prevent the metal filling layer 132 from diffusing or penetrating into the work function layer 130. The blocking layer may be made of tantalum nitride, titanium nitride, another suitable material, or a combination thereof. The blocking layer may be formed by using a CVD process, a PVD process, an ALD process, another applicable process, or a combination thereof.

Figure 1J:
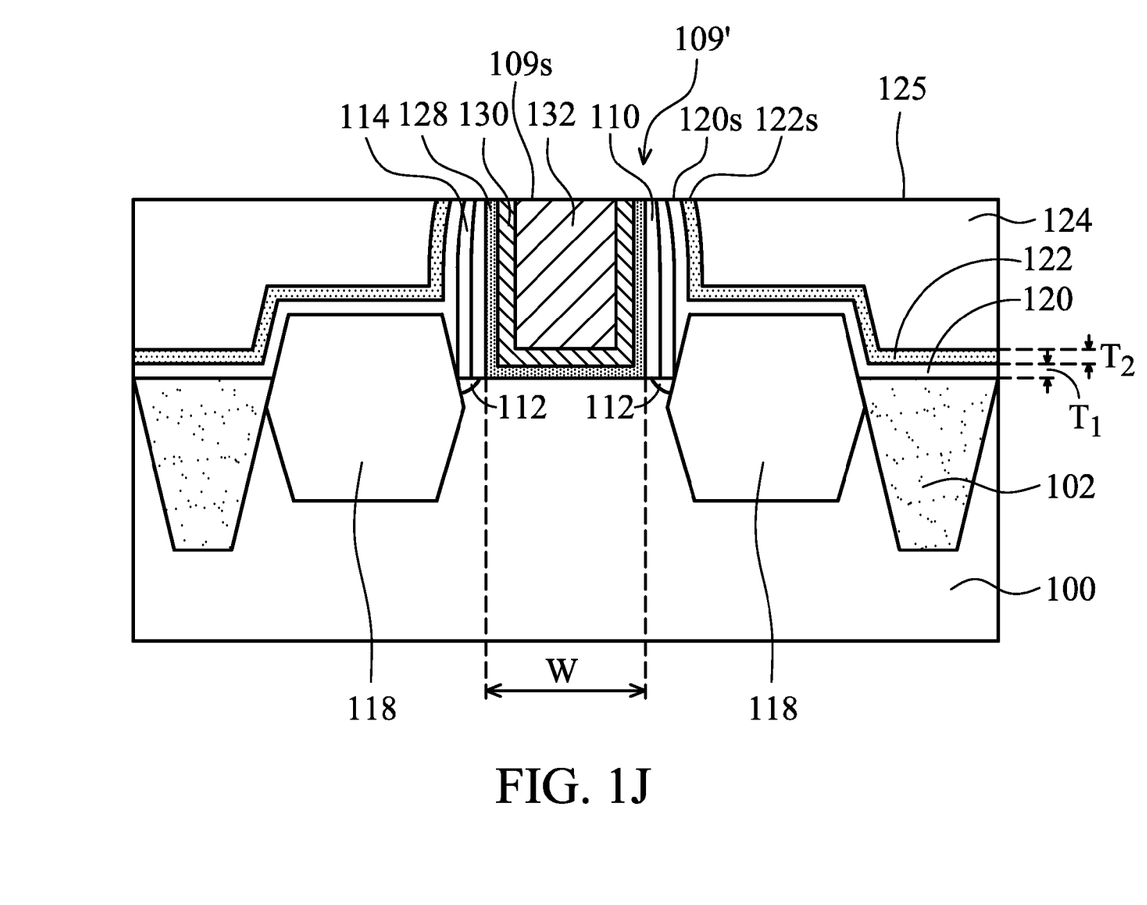

As shown in FIG. 1J, the gate dielectric layer 128, the work function layer 130, and the metal filling layer 132 outside of the recess 126 are removed, in accordance with some embodiments. As a result, a metal gate stack 109' including the gate dielectric layer 128, the work function layer 130, and the metal filling layer 132 is formed. In some embodiments, a planarization process is performed to remove the gate dielectric layer 128, the work function layer 130, and the metal filling layer 132 outside of the recess 126. The planarization process may include a CMP process, a grinding process, an etching process, another applicable process, or a combination thereof.

As shown in FIG. 1J, the gate stack 109', the interfacial layer 122, and the contact etch stop layer 120 have surfaces 109s, 122s, and 120s, respectively. In some embodiments, the surface 109s is substantially coplanar with the surfaces 125, 122s, and 120s.

Figure 1K:
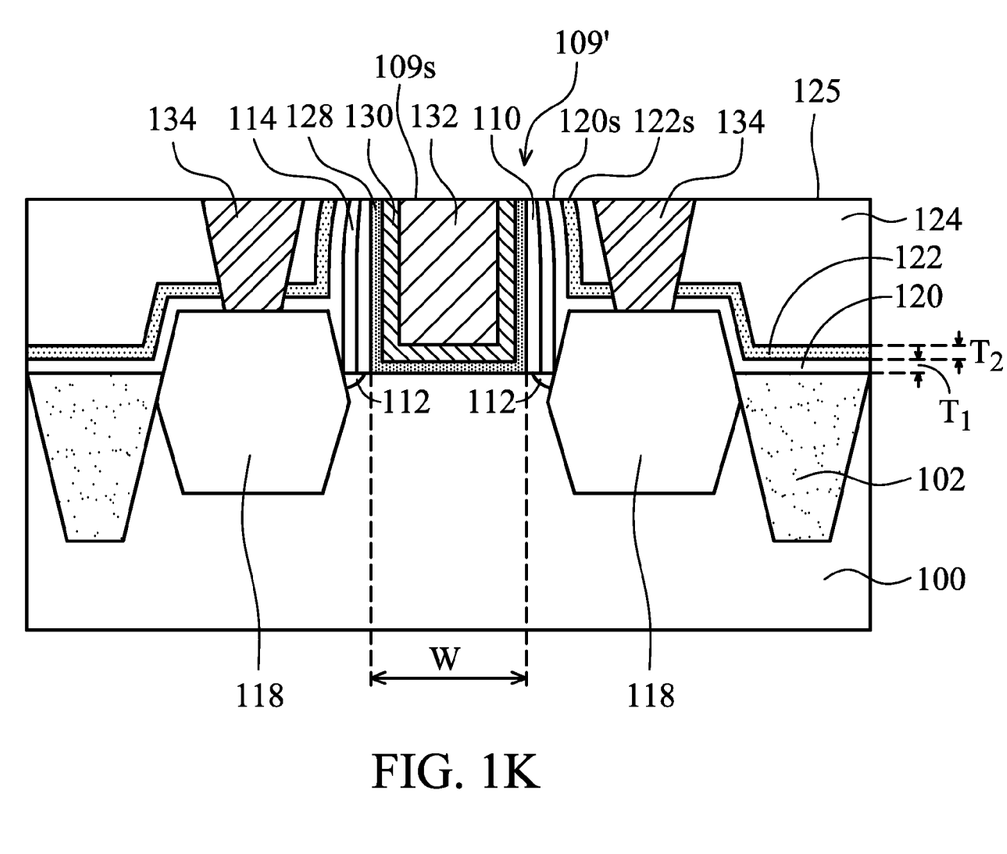

As shown in FIG. 1K, contact plugs 134 are formed in the dielectric layer 124, in accordance with some embodiments. Each of the contact plugs 134 is electrically connected to the source/drain feature 118. In some embodiments, each of the contact plugs 134 penetrates through the dielectric layer 124, the interfacial layer 122, and the contact etch stop layer 120. In some embodiments, contact holes are formed to expose the source/drain features 118. Afterwards, one or more conductive materials are formed in the contact holes to form the contact plugs 134.

In some embodiments, a photolithography process and an etching process are used to form the contact holes. In some embodiments, portions of the dielectric layer 124 and the interfacial layer 122 are removed in a first etching process to expose the contact etch stop layer 120. Afterwards, a second etching process is performed to remove the exposed portion of the contact etch stop layer 120. As a result, the contact holes are formed. The contact holes may expose the source/drain features 118. In some embodiments, a salicidation (self-aligned silicidation) process is performed to form metal silicide regions (not shown) on the source/drain features 118 exposed by the contact holes. Each of the metal silicide regions has a better conductivity. Device performance may be improved.

Afterwards, one or more conductive materials are deposited to fill the contact holes in some embodiments. The conductive materials may include copper, cobalt, aluminum, tungsten, titanium, gold, platinum, another suitable conductive material, or a combination thereof. In some embodiments, a planarization process is performed to remove the excess portions of the conductive materials outside of the contact holes. As a result, the contact plugs 134 are formed. Other operations may continue to complete fabrication of the semiconductor device.

Embodiments of the disclosure provide a method for forming a semiconductor device with a gate stack. An interfacial layer is formed between a contact etch stop layer and a dielectric layer. The interfacial layer has good adhesion with the contact etch stop layer and the dielectric layer. The bonding is therefore improved. Even if a dummy gate is removed, there is substantially no crack formed between the interfacial layer and the dielectric layer or between the interfacial layer and the contact etch stop layer. Therefore, the reliability and performance of the semiconductor device are significantly improved.

In accordance with some embodiments, a semiconductor device is provided. The semiconductor device includes a semiconductor substrate and a gate stack over the semiconductor substrate. The semiconductor device also includes a contact etch stop layer over the semiconductor substrate and sidewalls of the gate stack. The semiconductor device further includes a dielectric layer over the contact etch stop layer. In addition, the semiconductor device includes an interfacial layer between the contact etch stop layer and the dielectric layer.

In accordance with some embodiments, a semiconductor device is provided. The semiconductor device includes a semiconductor substrate and a metal gate stack over the semiconductor substrate. The semiconductor device also includes a contact etch stop layer over the semiconductor substrate and sidewalls of the metal gate stack. The semiconductor device further includes a dielectric layer over the contact etch stop layer. In addition, the semiconductor device includes an interfacial layer between the contact etch stop layer and the dielectric layer.

In accordance with some embodiments, a method for forming a semiconductor device is provided. The method includes forming a gate stack over a semiconductor substrate and forming a contact etch stop layer over the semiconductor substrate and the gate stack. The method also includes forming an interfacial layer over the contact etch stop layer. The method further includes forming a dielectric layer over the interfacial layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device structure, comprising:
   a semiconductor substrate;
   a gate stack over the semiconductor substrate;
   a contact etch stop layer over the semiconductor substrate and sidewalls of the gate stack;
   a dielectric layer over the contact etch stop layer; and
   an interfacial layer between the contact etch stop layer and the dielectric layer,
   wherein a top surface of the gate stack is substantially coplanar with a top surface of at least one of the dielectric layer, the interfacial layer, and the contact etch stop layer.

2. The semiconductor device as claimed in claim 1, wherein the interfacial layer and the dielectric layer are made of different materials.

3. The semiconductor device as claimed in claim 1, wherein the interfacial layer and the contact etch stop layer are made of different materials.

4. The semiconductor device as claimed in claim 1, wherein the interfacial layer comprises more hydroxyl groups than the dielectric layer.

5. The semiconductor device as claimed in claim 1, wherein the top surface of the gate stack is substantially coplanar with the top surface of the dielectric layer, the top surface of the interfacial layer, and the top surface of the contact etch stop layer.

6. The semiconductor device as claimed in claim 1, further comprising a spacer element between the gate stack and the contact etch stop layer.

7. The semiconductor device as claimed in claim 1, further comprising a contact plug, wherein the contact plug penetrates through the dielectric layer, the interfacial layer, and the contact etch stop layer to electrically connect to a source/drain feature on or in the semiconductor substrate.

8. The semiconductor device as claimed in claim 1, wherein the interfacial layer is in direct contact with the dielectric layer and the contact etch stop layer.

9. The semiconductor device as claimed in claim 1, wherein the dielectric layer is separated from the contact etch stop layer by the interfacial layer.

10. The semiconductor device as claimed in claim 1, wherein the interfacial layer is conformally formed over the contact etch stop layer.

11. A semiconductor device, comprising:
    a semiconductor substrate;
    a metal gate stack over the semiconductor substrate;
    a contact etch stop layer over the semiconductor substrate and sidewalls of the metal gate stack;
    a dielectric layer over the contact etch stop layer; and
    an interfacial layer between the contact etch stop layer and the dielectric layer,
    wherein the dielectric layer is separated from the contact etch stop layer by the interfacial layer.

12. The semiconductor device as claimed in claim 11, wherein the interfacial layer comprises more hydroxyl groups than the dielectric layer.

13. The semiconductor device as claimed in claim 11, wherein the interfacial layer is in direct contact with the dielectric layer and the contact etch stop layer.

14. The semiconductor device as claimed in claim 11, further comprising a contact plug, wherein the contact plug penetrates through the dielectric layer, the interfacial layer, and the contact etch stop layer to electrically connect to a source/drain feature on or in the semiconductor substrate.

15. A method for forming a semiconductor device, comprising:
    forming a gate stack over a semiconductor substrate;
    forming a contact etch stop layer over the semiconductor substrate and the gate stack;
    forming an interfacial layer over the contact etch stop layer;
    forming a dielectric layer over the interfacial layer; and
    replacing the gate stack with a metal gate stack.

16. The method for forming a semiconductor device as claimed in claim 15, further comprising planarizing the dielectric layer to expose the gate stack.

17. The method for forming a semiconductor device as claimed in claim 15, wherein the interfacial layer is formed by using an atomic layer deposition process.

18. The method for forming a semiconductor device as claimed in claim 15, further comprising forming a contact plug in the dielectric layer, wherein the contact plug is electrically connected to a source/drain feature formed on or in the semiconductor substrate.

19. The semiconductor device as claimed in claim 9, wherein the gate stack is a metal gate stack.

20. The semiconductor device as claimed in claim 1, wherein a bottom of the dielectric layer is lower than a top of the sidewalls of the gate stack.

* * * * *